United States Patent
Duquette et al.

(10) Patent No.: US 6,762,847 B2
(45) Date of Patent: Jul. 13, 2004

(54) LASER ALIGN SENSOR WITH SEQUENCING LIGHT SOURCES

(75) Inventors: David W. Duquette, Minneapolis, MN (US); Frederick M. Cash, II, Maple Grove, MN (US); Steven K. Case, St. Louis Park, MN (US); John P. Konicek, Minneapolis, MN (US); Thomas L. Volkman, Minneapolis, MN (US)

(73) Assignee: CyberOptics Corporation, Golden Valley, MN (US)

(*) Notice: Subject to any disclaimer, the term of this patent is extended or adjusted under 35 U.S.C. 154(b) by 517 days.

(21) Appl. No.: 09/767,199

(22) Filed: Jan. 22, 2001

(65) Prior Publication Data

US 2002/0126296 A1 Sep. 12, 2002

(51) Int. Cl.⁷ .......................... G01B 11/14; G01N 21/86
(52) U.S. Cl. .................. 356/614; 356/622; 250/559.32
(58) Field of Search ................. 356/614, 615, 356/620, 622; 250/559.3, 559.32; 328/151; 29/833; 348/126

(56) References Cited

U.S. PATENT DOCUMENTS

| | | | |
|---|---|---|---|
| 4,615,093 A | 10/1986 | Tews et al. | 29/407 |
| 4,974,010 A | 11/1990 | Cleveland et al. | 354/403 |
| 5,278,634 A | 1/1994 | Skunes et al. | 356/400 |
| 5,377,405 A | 1/1995 | Sakurai et al. | 29/833 |
| 5,467,186 A | 11/1995 | Indo et al. | 356/150 |
| 5,491,888 A | 2/1996 | Sakurai et al. | 29/832 |
| 5,559,727 A | 9/1996 | Deley et al. | 364/559 |
| 5,570,993 A | 11/1996 | Onodera et al. | 414/783 |
| 5,687,475 A | 11/1997 | Doemens | 29/833 |
| 5,724,722 A * | 3/1998 | Hashimoto | 29/740 |
| 5,741,114 A | 4/1998 | Onodera | 414/783 |
| 5,749,142 A | 5/1998 | Hanamura | 29/833 |
| 5,815,272 A | 9/1998 | Harding | 356/375 |
| 5,818,061 A | 10/1998 | Stern et al. | 250/559.29 |
| 5,871,391 A | 2/1999 | Pryor | 451/9 |
| 5,897,611 A | 4/1999 | Case et al. | 702/150 |
| 5,900,940 A * | 5/1999 | Aoshima | 356/614 |
| 5,956,149 A | 9/1999 | Suzuki et al. | 356/375 |
| 6,028,671 A | 2/2000 | Svetkoff et al. | 356/368 |

FOREIGN PATENT DOCUMENTS

| | | |
|---|---|---|
| JP | 6-21697 | 1/1994 |
| JP | 8-111598 | 4/1996 |
| JP | 9-293998 | 4/1996 |
| JP | 9-210626 | 8/1997 |
| JP | 9-214198 | 8/1997 |
| JP | 9-246794 | 9/1997 |
| JP | 09-293998 | 11/1997 |
| JP | 9-307298 | 11/1997 |
| JP | 10-93298 | 4/1998 |
| JP | 10-148514 | 6/1998 |

(List continued on next page.)

OTHER PUBLICATIONS

U.S. patent application Ser. No. 08/904,950, Bartunek et al., filed Aug. 1, 1997.

*Primary Examiner*—Frank G. Font
*Assistant Examiner*—Roy M. Punnoose
(74) *Attorney, Agent, or Firm*—Westman, Champlin & Kelly, P.A.

(57) ABSTRACT

A sensor for sensing placement information of a component to be placed by a pick and place machine is disclosed. The sensor includes a plurality of light sources each of which is disposed to direct illumination at different angles of incidence upon the component. Each source is further adapted to generate light based upon an energization signal. Source control electronics are provided and coupled to the plurality of light sources to successively and/or provide energization signals to each source. A detector is disposed within the sensor relative to the plurality of sources to receive at least one shadow of the component, and provide data at a detector output indicative of the shadow imaged while the component is rotated.

53 Claims, 8 Drawing Sheets

FOREIGN PATENT DOCUMENTS

| | | |
|---|---|---|
| JP | 10-284890 | 10/1998 |
| JP | 11-251797 | 9/1999 |
| JP | 2000-31697 | 2/2000 |
| JP | 2000-13400 | 5/2000 |
| WO | WO 97/30572 | 8/1997 |
| WO | WO 99/62313 | 12/1999 |

* cited by examiner

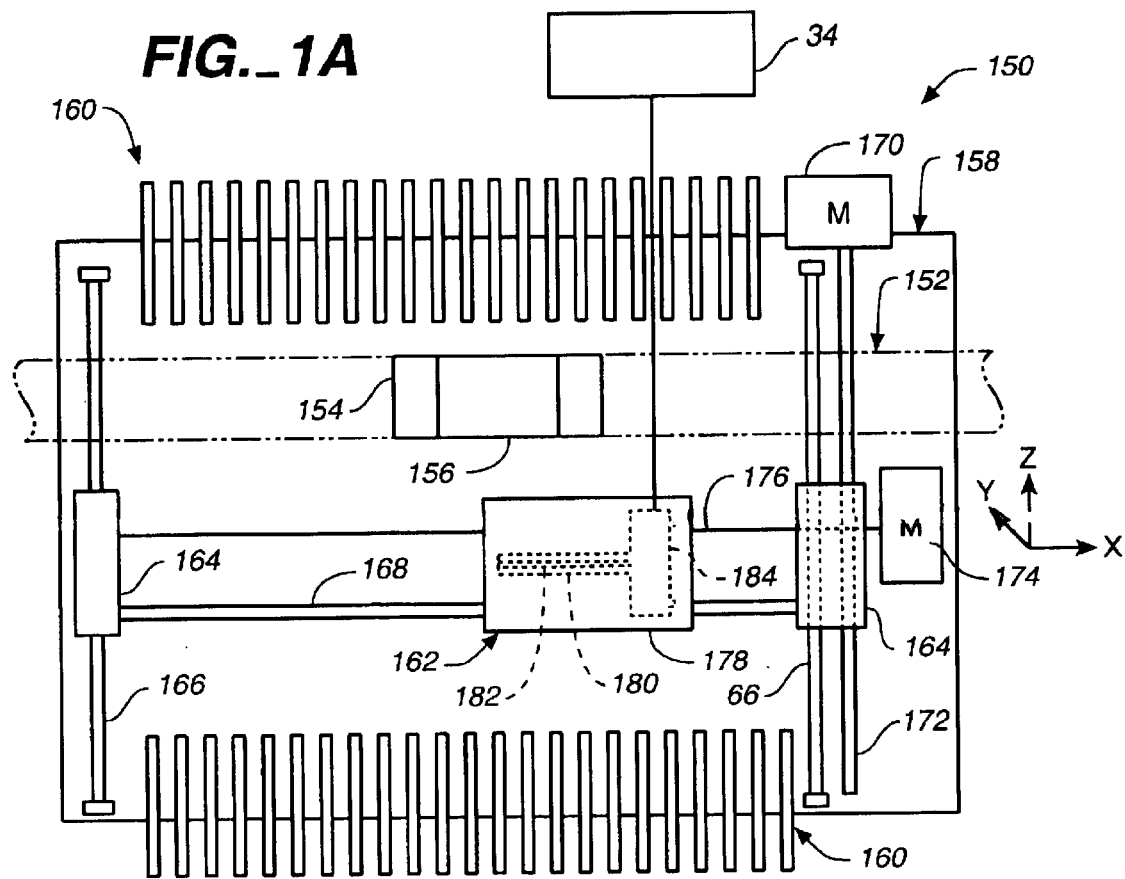
FIG._1A
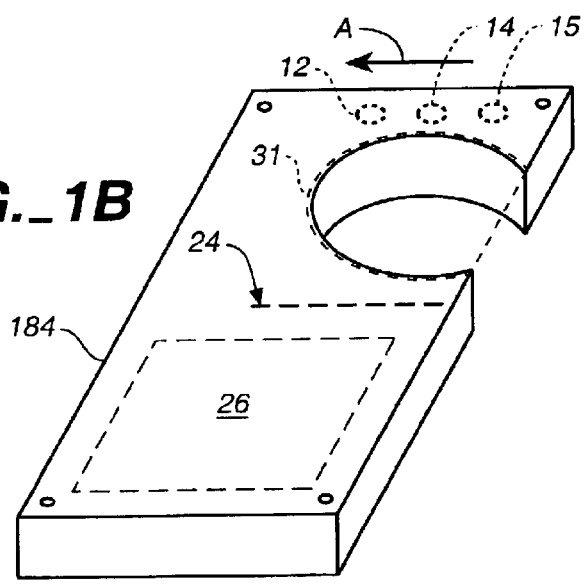
FIG._1B

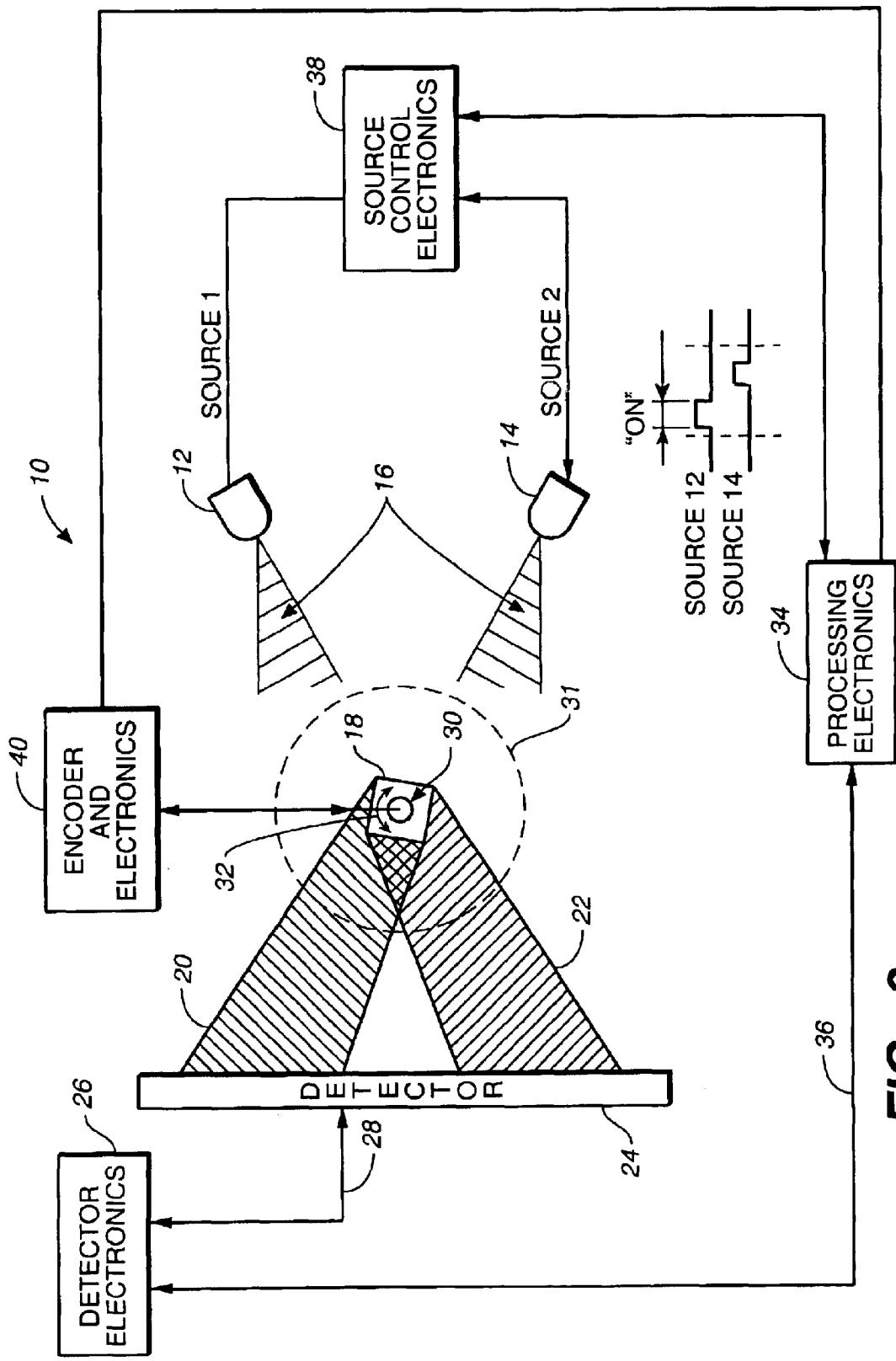
FIG._2

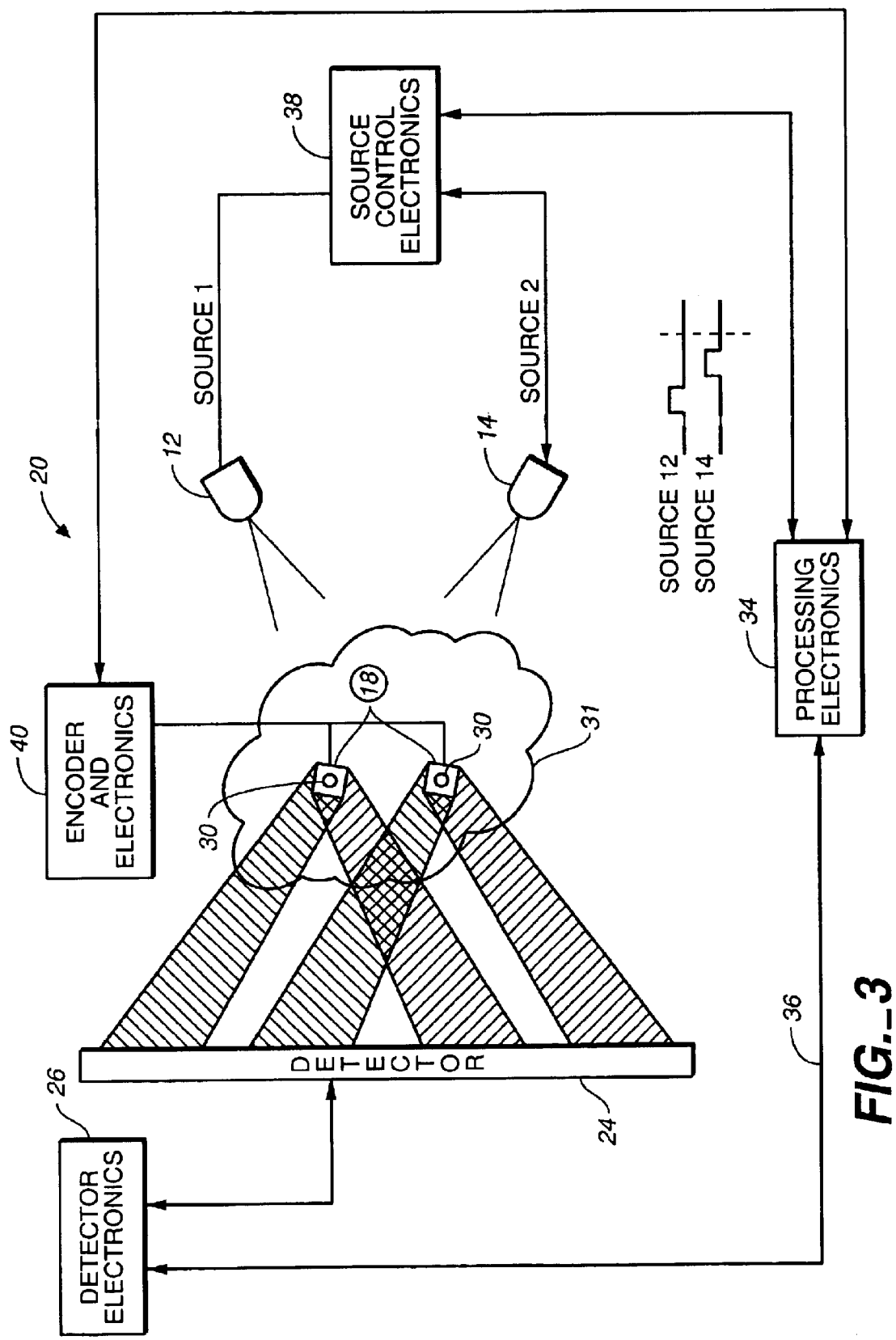
FIG._3

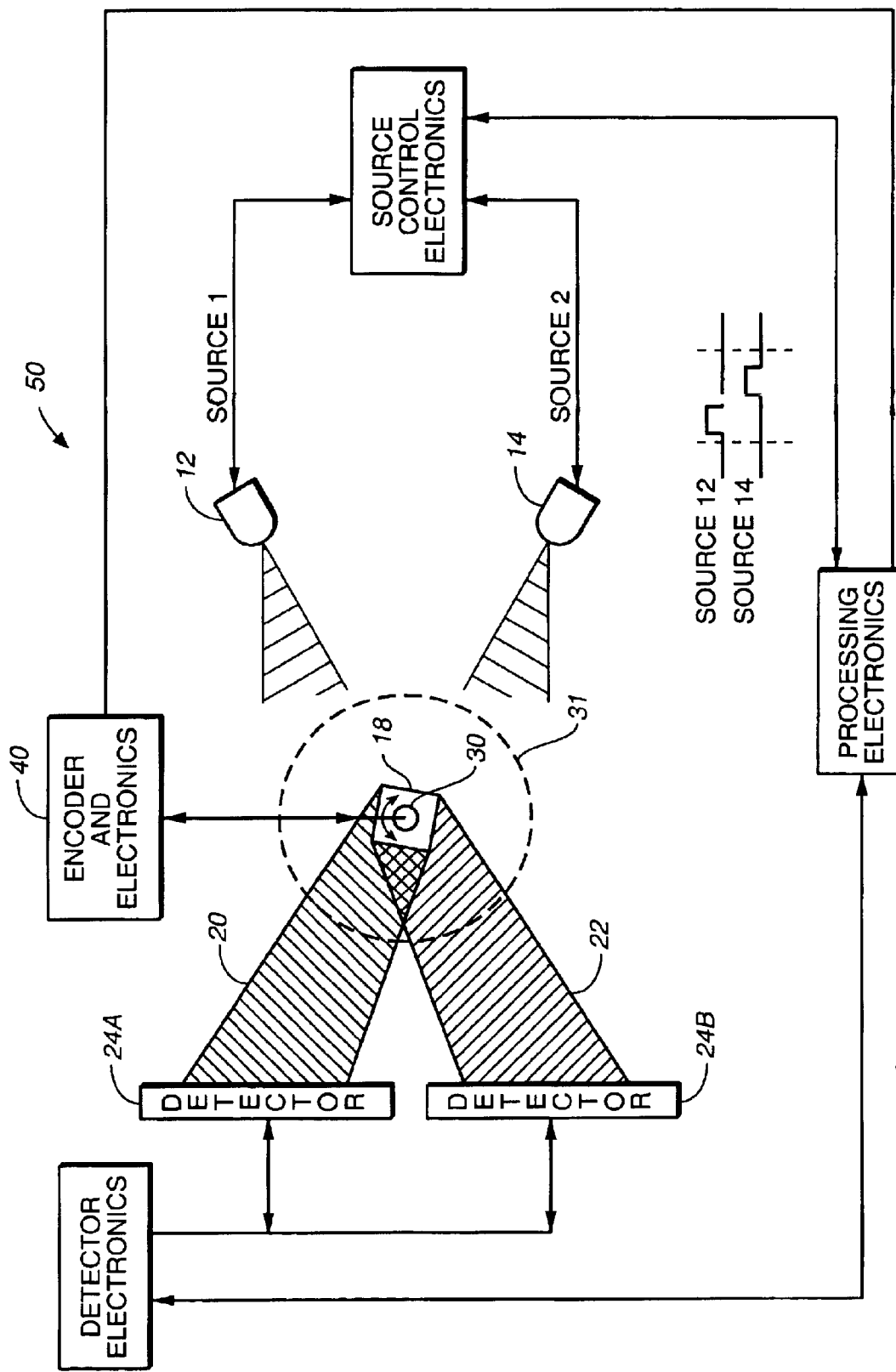
FIG._4

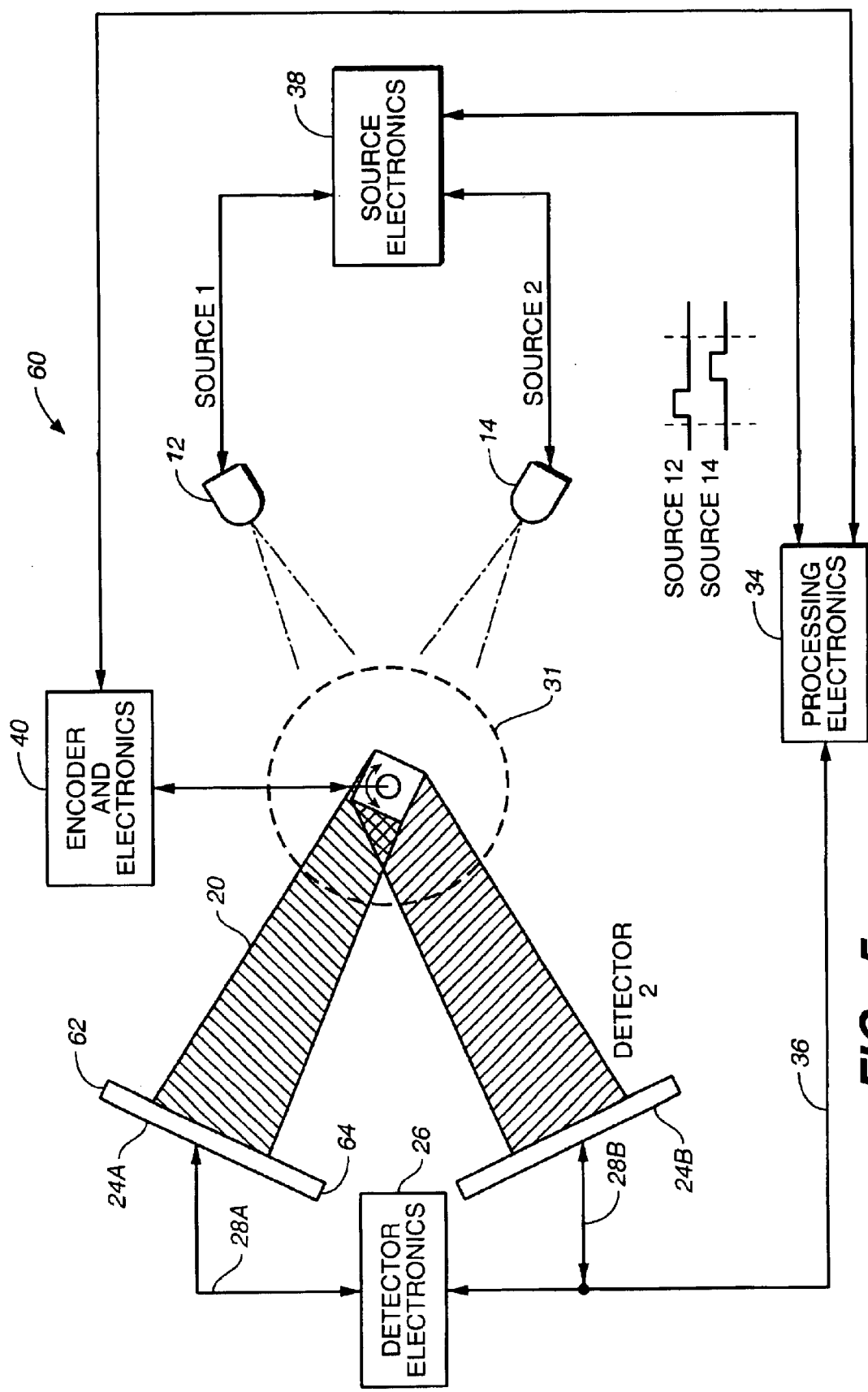
FIG._5

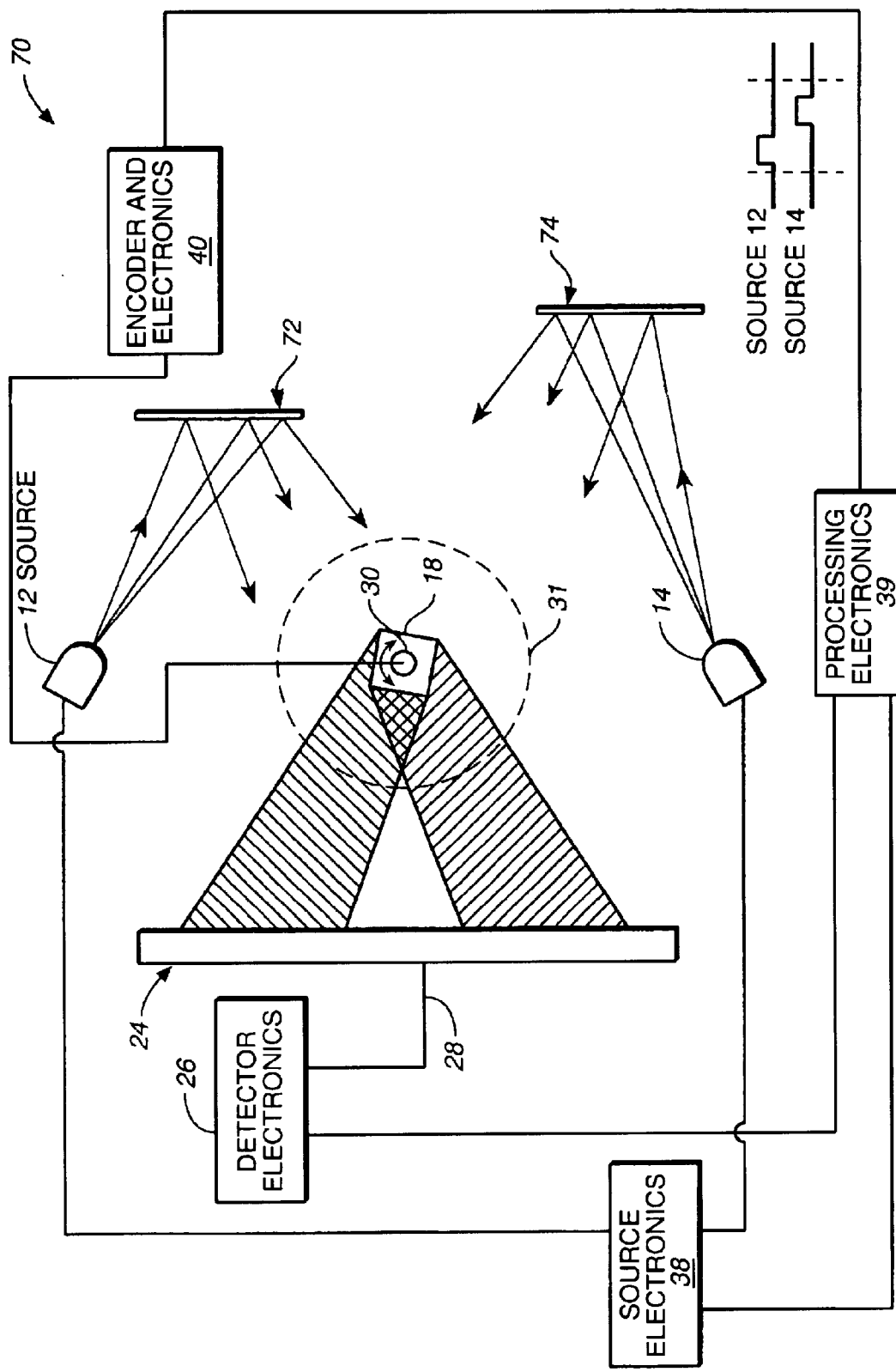

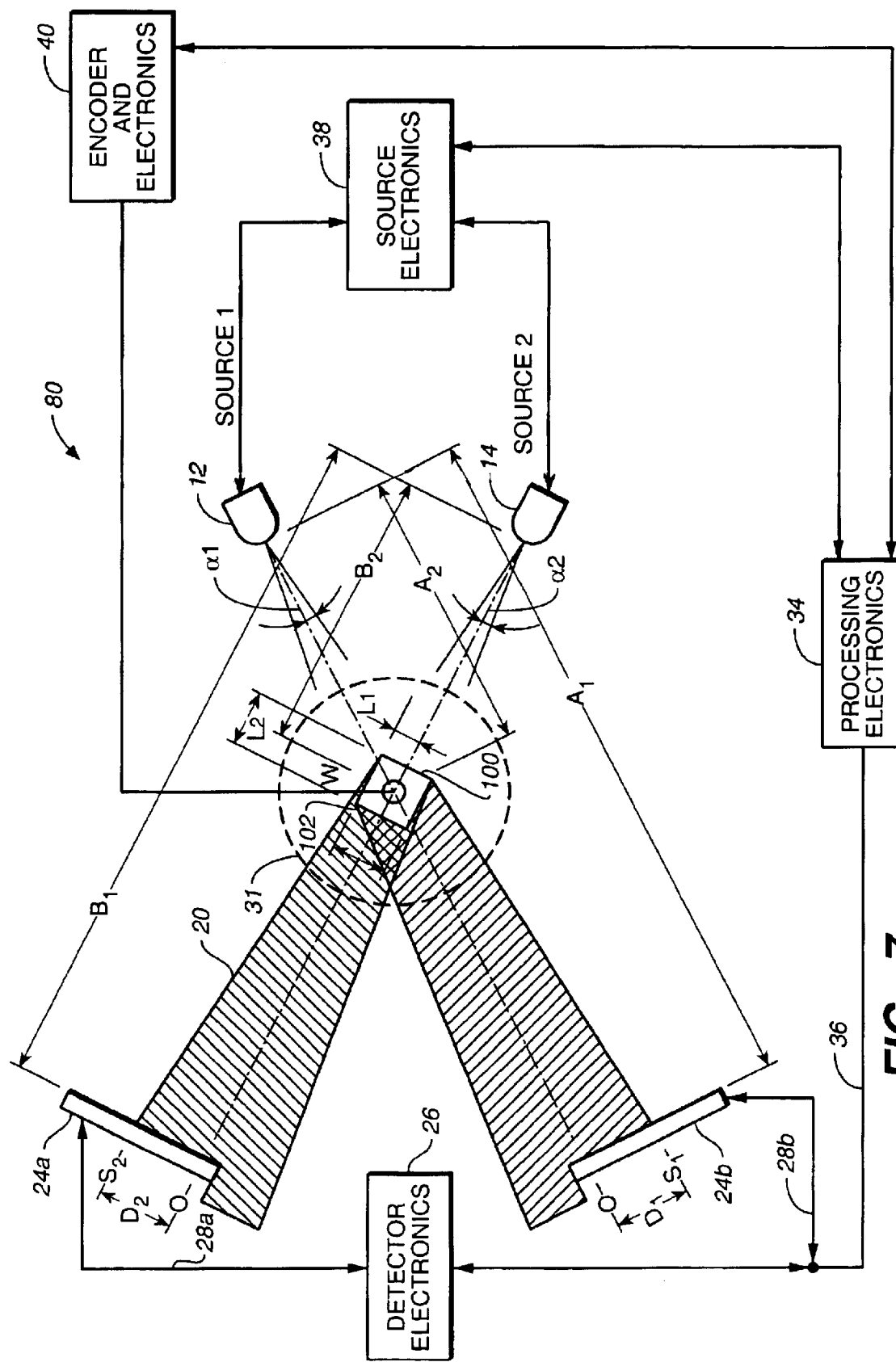
FIG._7

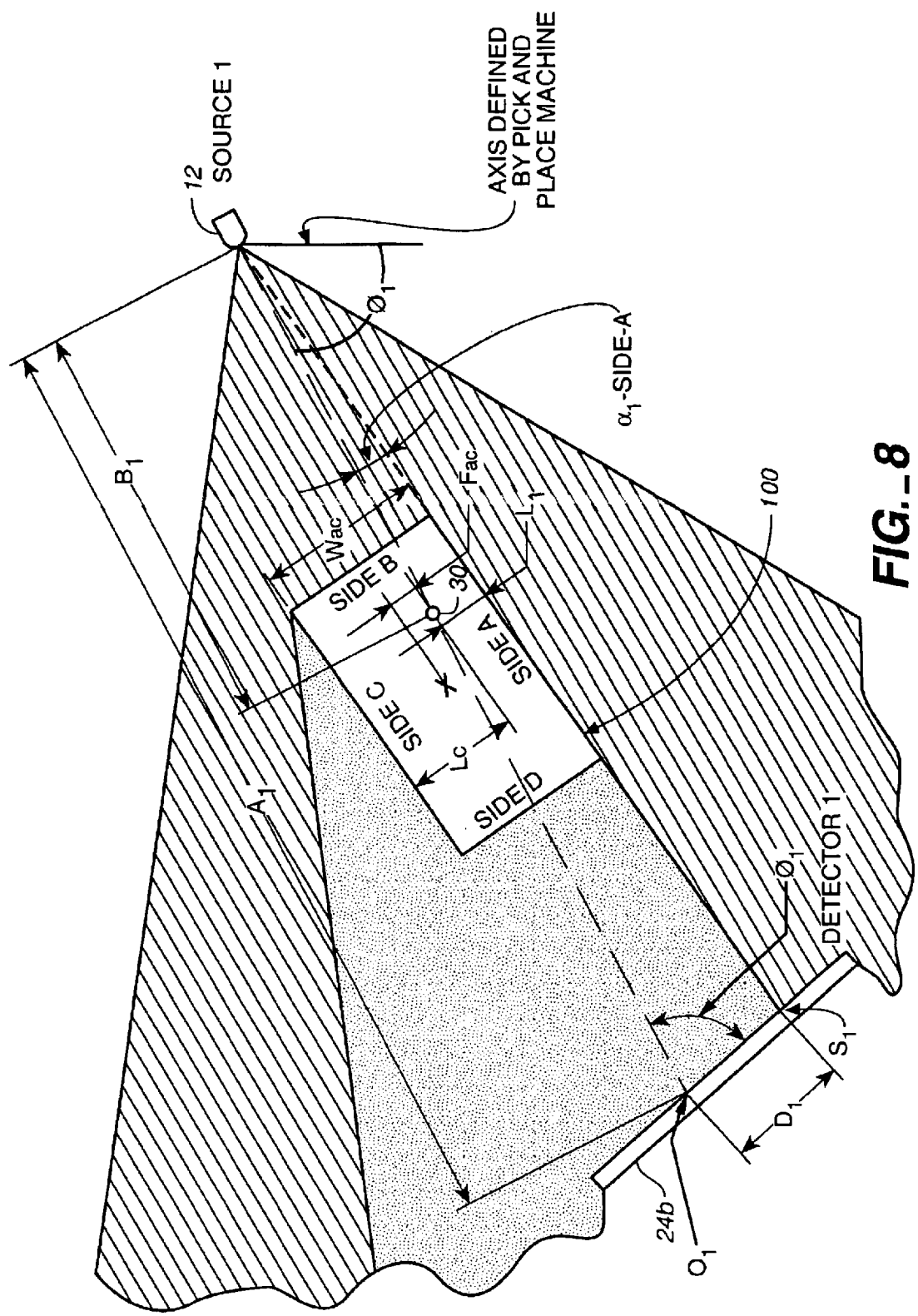
FIG._8

US 6,762,847 B2

LASER ALIGN SENSOR WITH SEQUENCING LIGHT SOURCES

BACKGROUND OF THE INVENTION

The present invention relates to control systems which align electrical components for precise placement via pick-and-place machines onto surfaces such as printed circuit boards, hybrid substrates containing circuitry traces, and other carriers of circuit tracings. More specifically, the present invention relates to a non-contact light-based sensor system which precisely determines angular orientation and location (x, y) of components to allow a pick and place machine to correct angular orientation of the component with respect to the pick and place machine's coordinate system for proper placement.

The electronic device assembly industry uses pick and place machines to automatically "pick" components from standardized feeder mechanisms, such as tape reels, and "place" such components upon appropriate carriers such as printed circuit boards. A given printed circuit board may include a large number of such components and thus the automation of component placement upon the printed circuit board is essential for cost effective manufacture. One important aspect of a given pick and place machine is the manner in which component orientation and location are detected prior to placement. Some pick and place machines transport the component to an inspection station where it is imaged by an inspection camera, or the like (i.e. off-head systems). Once imaged, the controller, or other appropriate device, calculates orientation and location information from the component image. One drawback associated with such systems is the added time required to transport the component to the imaging station; to image the component; and to transport the component from the imaging station to the placement location. Another type of pick and place machine uses an "on-head" sensor to essentially image the component while being transported from the component feeder to the placement location. Thus, in contrast to the above example, on-head component inspection systems typically allow higher component throughput and thus lower cost manufacture.

Pick and place machines that incorporate on-head sensors are known. One such device is taught in U.S. Pat. No. 5,278,634 issued to Skunes et al., and assigned to the assignee of the present invention. U.S. Pat. No. 5,278,634 discloses an on-head component detector that uses a single light source to direct illumination at and past a component of interest, which illumination then falls upon a detector. The component fits through a fixed size window in the housing of the Skunes '634 sensor. With the light energized, the component is rotated by a vacuum quill while the width of the shadow cast upon the detector is monitored. The minimum shadow width is registered when the sides of a rectangular component are aligned normally with respect to the source. Associated electronics, sometimes resident in the pick-and-place machine, compute the desired rotational movement of the nozzle (with knowledge of reference axes of the pick-and-place machine). This allows angular orientation of the component, as well as component position to be determined, and corrected for proper placement.

Other pick-and-place machines employ sensors with multiple light sources in the sensor, to accommodate components of varying sizes.

Although the system taught by Skunes et al. has provided a significant advance to the art of electronic component placement in pick and place machines, an efficient sensor adapted for use with components having a wide range of sizes would provide faster placement and less machine down-time to exchange sensors with different sized components.

SUMMARY OF THE INVENTION

A sensor for sensing placement information, including rotational offset, positional offset (x, y), width and length of a component to be placed by a pick and place machine is disclosed. The sensor includes a plurality of selectably energizable light sources, each of which is disposed to direct illumination at different angles of incidence upon the component. Source control electronics are provided and coupled to the plurality of light sources to successively and/or selectively provide an energization signal to each source, so that when the component is at least partially disposed in the sensing field, the component blocks illumination from at least one of the plurality of light sources to form a shadow of at least a portion of the component on the detector. Computing electronics receive the detector outputs to compute the placement information, relative to a coordinate system of the pick and place machine. The detector is adapted to provide a plurality of detector outputs while the component rotates. A detector is disposed within the sensor relative to the plurality of sources to receive at least one partial shadow of the component, and provide a plurality of detector outputs indicative of the shadow(s) imaged on the detector while the component is rotated by the pick-and-place machine.

In one embodiment of the invention, a priori knowledge of the component size is not required.

BRIEF DESCRIPTION OF THE DRAWINGS

FIG. 1A is a top plan view of a pick and place machine of the present invention.

FIG. 1B is a perspective drawing of a sensor of the present invention.

FIG. 2 is a diagrammatic view of a system for detecting component orientation and location in accordance with an embodiment of the present invention.

FIG. 3 is a diagrammatic view of a system for detecting component orientation and location in accordance with another embodiment of the present invention.

FIG. 4 is a diagrammatic view of a system for detecting component orientation and location in accordance with another embodiment of the present invention.

FIG. 5 is a diagrammatic view of a system for detecting component orientation and location in accordance with another embodiment of the present invention.

FIG. 6 is a diagrammatic view of a system for detecting component orientation and location in accordance with another embodiment of the present invention.

FIG. 7 is a diagrammatic view of a system for detecting component orientation and location in accordance with another embodiment of the present invention.

FIG. 8 is a diagrammatic view of a single detector source pair.

For convenience, items in different figures having the same reference designator number are the same, or serve the same or a similar function, as appropriate.

DETAILED DESCRIPTION OF THE PREFERRED EMBODIMENTS

FIG. 1A is a top plan view of pick and place machine 150 for which embodiments of the present invention are particularly useful. Although the description of FIG. 1A will be provided with respect to pick and place machine 150, other forms of pick and place machines such as split gantry designs, can be used. As illustrated in FIG. 1A, machine 150 includes transport mechanism 152 that is adapted to transport a workpiece such as a printed circuit board. Transport mechanism 152 includes mounting section 154 and conveyor 156. Transport mechanism 152 is disposed on base 158 such that the workpiece is carried to mounting section 154 by conveyor 156. Feeder mechanisms 160 are generally disposed on either side of transport mechanism 152 and supply electronic components thereto. Feeders 160 can be any suitable devices adapted to provide electronic components.

Pick and place machine 150 includes head 162 disposed above base 158. Head 162 is moveable between either of feeder mechanisms 160 and mounting section 154. As can be seen, head supports 164 are moveable on rails 166 thereby allowing head 162 to move in the y direction over base 158. Movement of head 162 in the y direction occurs when motor 170, in response to a motor actuation signal, rotates ball screws 172 which engages one of head supports 164 to thereby displace the support 164 in the y direction. Head 162 is also supported upon rail 168 to allow head movement in the x direction relative to base 158. Movement of head 162 in the x direction occurs when motor 174, in response to a motor actuation signal, rotates ball screw 176, which engages head 162 and displaces head 162 in the x direction. Other pick-and-place designs, even those which do not operate exclusively in x and y movements, may be adapted for use with the present invention.

Head 162 generally includes body 178, nozzle mount 180, nozzles 182, and sensor 184. Nozzle mount 180 is disposed within body 178 and mounts each of nozzles 182 within body 178. As used herein, "nozzle" is intended to mean any apparatus capable of releasably holding a component. Each of nozzles 182 is movable in the z direction (up/down), x and y directions, and is rotatable about the z axis by any suitable actuation members, such as servo motors. Sensor 184 is adapted to acquire shadow information related to components held by nozzles 182. Sensor 184 includes suitable illumination devices and detection devices such that sensor 184 can provide shadow information that varies based upon component orientation and off-set. Sensor 184 can be mounted on head 162, or alternatively sensor 184 can be mounted at a fixed location with respect to head 162. The information provided by sensor 184 to processing electronics 34 is used to calculate respective component orientations and offsets. Such information includes calculating offset in the x and y axes as well as rotational offset.

FIG. 1B shows sensor 184 separately, with sources 12, 14, 15. Component(s) fit partially within sensing field 31, and obscure illumination from each of the successively energized sources as it falls onto a detector 24. Electronics 26 receive a plurality of outputs from the detector as a nozzle (now shown) rotates the component. Electronics 26 may be partially located outside of sensor 184 in a pick and place machine.

FIG. 2 is a diagrammatic view of component orientation and placement detection system 10 in accordance with an embodiment of the present invention. System 10 includes sources 12, 14 which are arranged to direct illumination 16 upon component 18 from at least two different angles. Sources 12, 14 can be any suitable light sources as long as they provide illumination of sufficient intensity, as considered from each source. Thus, sources 12, 14 can be incoherent or coherent of illumination sources. Preferably, sources 12, 14 are laser diodes, but in some embodiments, sources 12, 14 are light emitting diodes (LED's). Sources 12, 14 can be positioned to provide illumination in substantially the same plane, as defined by either of the sources and two points on the detector (a beginning and an ending pixel on the detector). Although a pair of sources 12, 14 are shown, any suitable number of sources, such as three sources, can be used. Illumination 16 from sources 12, 14 is blocked, to some extent, by component 18 to thereby generate shadows 20, 22, respectively, on detector 24 which is preferably a linear (charge coupled device (CCD) or CMOS) sensor. Detector 24 includes a number of photoelectric elements, or pixels. Detector 24 essentially captures shadows 20, 22 in a brief instant of time and provides data (e.g. detector output) related to the captured shadow image to detector electronics 26 via link 28. As desired, an additional optical components (e.g. lenses, prisms, etc.) may be placed in front of the detector 24 so that the image of the component (the imaged or focused shadow) is incident upon detector 24, which then provides detector output representative of the shadow image rather than the shadow. As used herein, "shadow" is intended to mean any representation that is generated in part by light of intensity that varies based upon at least partial obstruction by a component of interest. Thus, a shadow may or may not be focussed before falling upon a detector.

As component 18 is held, or otherwise affixed to nozzle 30, component 18 is rotated as indicated by arrow 32 while sources 12, 14 are selectively energized. As can be appreciated, during rotation of part 18, shadows 20, 22 will change size and position based upon the cross sectional area of component 18 obstructing a given beam 16 of illumination. The signal from detector 24 is read, and/or stored during rotation of component 18 such that data from detector 24 is used to compute rotational orientation of component 18 as well as location (x,y) of component 18 with respect to nozzle 30. Detector electronics 26 provides this data to processing electronics 34 via link 36. As illustrated in FIG. 2, processing electronics 34 is also preferably coupled to source control electronics 38 such that processing electronics 34 controls energization of sources 12, 14 during rotation of component 18. Source control electronics 38, or energization electronics 38, is mounted within sensor 184 in some embodiments. Processing electronics 34 can reside within a suitable personal computer and includes appropriate software for computing angular orientation and offset. Processing electronics 34 is also coupled to encoder 40 such that processing electronics 34 is provided with a signal from encoder 40 that is indicative of angular orientation of nozzle 30. Thus, by essentially knowing which sources are energized, knowing the angular orientation of nozzle 30 as indicated by encoder 40, and by detecting images of the shadows cast by component 30 while rotated, processing electronics 34 computes component orientation and location, given suitable knowledge of the internal geometry of the sensor.

FIG. 2 shows a double edged measurement, as considered with respect to either of the sources 12, 14, since shadows of two edges of component 18 fall on detector 24.

Various embodiments of the present invention are designed to be able to extract component information (part size, center offset, and angular orientation, etc.) using any combination of single edge and double edge measurements of the component under inspection. Typically, double edge measurements are used when the dimensions of the component allow the shadows of both component edges to fall upon the detector during the same component measurement time, without overlapping, as illustrated in FIG. 2. Thus, at least two edges of the component can be shadowed onto the detector by different sources within the same component measurement time. The difference between single edge measurement and double edge measurement is that during the single edge measurement process, only one edge of the component is shadowed by any source onto the detector due to the component being so large that the shadow of the other edge of the component would not fall on the detector.

Two or more sources are sequenced to reduce elapsed time before image information is collected for computation. This is particularly advantageous when these sources are spaced separately with respect to the plane that is defined by either of the sources and two points on the detector, and the CCD or imaging array (see, for example, FIG. 1B). Since the sources are generally at differing angular positions from each other relative to a line drawn from nozzle 30 normal to the surface of detector 24, each of sources 12, 14 will have its principal ray directed at a different angle with respect to this normal line as incident onto component 18. As used herein, the principal ray is that ray emanating from the center of the illumination generated by the radiation source, nominally referenced from the mechanical axis of the detector body, such that the core of emanated radiation, (which is typically symmetrical) is bisected by the principal ray. This allows the information included in the shadow, such as edge information, to represent a different spatial position of the component, i.e. the edge of one side may be lined up with respect to the source 12 and, in less than 90 degrees of component rotation another side may be lined up with respect to source 14, as illustrated in FIG. 2.

The light sources 12, 14 are sequenced in any suitable manner. For example, sequencing sources 12, 14 at the full frame readout rate of detector 24 (e.g. 2 kHz line read-out rate), reduces the amount of time that elapses between these sources being sequenced such that the amount of angular rotation of the component during that interval is relatively small. By sequencing the sources so, shadow images derived from either source individually can be obtained such that the movement of the component between any particular shadow image can be reduced, thus reducing the granularity and enhancing the resolution of the sequence of images from that particular source. Each source allows collection of shadow images from a different rotational positions of the component. Based on the different source locations with respect to the component, shadow images from more than one angular position of the component are collected within a relatively small time. The component information can be collected in less time than would be required if a single source were energized to collect the data since full rotation of the component would be required in order to obtain the angular information.

Another important feature of embodiments of the present invention is the ability to create a measurement envelope, or "sensing field" of varying dimension. As used herein, a "sensing field" is a cumulative space illuminated by the energized sources in the sensor (when all sources are energized), as modified by any mechanical obstruction such as a housing. Thus, a sensing field need not even require a mechanical housing. The sensing field is formed by accommodating a plurality of sources positioned such that a single sensor can sense orientation for components of varying size. For example, if a component is 25 millimeters from side-to-side then one energized source, placed 12.5 millimeters from the nominal center of the component and disposed normal to the detector with its principal ray, would capture the edge of the component that was rotating in the sensing field. This embodiment, in its simplest form, requires only one energized source per component size. The sources have a specified solid cone angle of light emitted from them so the distance from the nominal center, and lateral or roughly parallel to, the detector surface as discussed above can be adjusted to account for this divergence of the source light in order to cast a shadow of the edge of the part. However, a source that is placed with its principal ray pointing at, for example, an 8 millimeter position from nozzle 30 and along the diameter of the component 18 parallel to detector 24 would be blocked, depending on the relative orientation of the solid angle of light as well as the position of the source. Based upon the solid angle of each source 12, 14, and the component size, each source will illuminate various sections of the component. It is important to select which one or more of the plurality of sources to energize, since differently sized components mandate the use of different sources to generate even a portion of a shadow. Source control electronics 38 can also provide selective source energization based upon anticipated component size. However, source control electronics can provide varying energization sequences for components of the same size in order to expedite processing, or provide additional information about the components.

As components are exchanged from small to larger parts in the same sensor, sources having principal rays that are pointed increasingly further along a line parallel to, or lateral from, detector 24, but measured from a line normal to detector 24, through nozzle 30 or the center of rotation of the component will image increasingly large components' edges by selectively sequencing sources 14, 12. (See arrow A in FIG. 1B). Preferably, sources 14, 12 are sequenced to cast shadows from multiple sides of component 18 in the same small measurement time interval (in the case where each source casts a shadow of a side). Selection of an appropriate source allows the source, generally based on a priori knowledge of expected part size, to be turned on such that an edge of component 18 can be imaged onto the detector 24. This allows components of varying sizes to be imaged on detector 24 without requiring the use of multiple sensors that are of a varying fixed measurement envelopes, or sensing fields.

Although the description above has focused on embodiments where a single nozzle is disposed within the sensing field, other embodiments can provide any suitable number of nozzles in the sensing field. FIG. 3 is a diagrammatic view of system 20 for detecting component orientations in accordance with another embodiment of the present invention. System 20 includes many of the same or similar elements as system 10 shown in FIG. 2 and like elements are numbered similarly. FIG. 3 illustrates that more than one nozzle 30 can be disposed in the sensing field 31, such that multiple component orientations and the locations can be imaged substantially simultaneously in order to reduce processing time.

The sensing field 31 is the area between the radiation (light) sources, and the detector, where components placed upon the nozzles will have light directed upon them. In this embodiment, shadows from the components' edges are cast upon detector 24. Depending upon the locations of nozzles 30 and sources 12, 14, a particularly sized component 18 is measured by sequencing the various sources 12, 14, etc. such that shadows of the component 18 can be distinguished from shadows of components on other nozzles. Source 12, 14 time sequencing is shown in FIG. 3 where electronics 38 energizes source 12 first, and then energizes source 14. This has an advantage of allowing more than one component 18 to be measured in the sensing area at essentially the same time. Further, depending upon the spacing of nozzles 30, the nozzles can hold components of varying sizes, yet still allow measurement of the component to be accomplished while such components are rotated on the nozzles.

FIG. 3 is an example of a double edged measurement, as considered with respect to sources 12, 14, since shadows of the two edges of component 18 fall on detector 24.

FIG. 4 is a diagrammatic view of component measurement system 50 in accordance with another embodiment of the present invention. FIG. 4 illustrates a sensing field 31 where detector 24 comprises two spaced-apart detector portions 24A, 24B, each one of which receives light incident from a specific source 12, 14. Detector portions 24A and 24B can be disposed adjacent to one another at a variety of angles, since each source detector pair operates independently. The principal axis of detector 24A need not be in the same plane as the principal axis of detector 24B. Moreover, detector portions 24A and 24B can be arranged to image shadows from different parts of the component. Using separate detector portions allows for the use of smaller detector portions, and, if necessary, allows the detector portions 24A, 24B to be packaged separately. In this manner, a very long detector 24 is not required in order to establish the same large component sensing envelope or field 31. However, sequencing of sources 12, 14 is essentially the same as in the previous embodiment.

FIG. 4 is an example of a double edged measurement as considered with respect to sources 12, 14, since shadows of two edges of component 18 fall on each of detectors 24A, 24B.

FIG. 5 is a diagrammatic illustration of component measurement system 60 in accordance with another embodiment of the present invention. System 60 bears many similarities to system 50, shown in FIG. 4, and like components are numbered similarly. The main distinction between systems 60 and 50 is the relative orientations of detector portions 24A and 24B. Specifically, referring to FIG. 4, faces of detector portions 24A and 24B lie in approximately the same plane, and when viewed in two dimensions, appear co-linear. However, system 60, shown in FIG. 5, illustrates detector portions 24A and 24B disposed such that the principal axes of detector portions 24A and 24B do not lie in the same plane. Thus, detector portions 24A and 24B of systems 60 do not appear co-linear with respect to each other. Instead, detector portions 24A and 24B are disposed normal to a centerline of illumination from the respective source for each detector portion. For example, detector portion 24A appears to be oriented relative to source 14 such that ends 62 and 64 are equidistant from source 14. Detector portion 24A is also disposed in the plane of shadow 20, and source sequencing operates as shown in the relative timing diagram in FIG. 5. Although detector portions 24A and 24B are shown disposed at a relatively slight angle with respect to each other, any suitable angle such as ninety degrees can be used.

FIG. 5 is an example of a double sided measurement, as considered with respect to each source, since shadows of two edges of component 18 fall on each of detectors 24A, 24B.

FIG. 6 is a diagrammatic view of component measurement and detection system 70 in accordance with another embodiment of the present invention. System 70 is similar to the embodiment shown in FIG. 2 and like elements are numbered similarly. The main distinction between systems 70 and 10, in FIGS. 6 and 2 respectively, is the provision of reflective surfaces 72, 74. As can be seen, sources 12, 14 direct their illumination away from detector 24 initially, which illumination falls upon reflectors 72, 74, (typically substantially specular) respectively, and is directed toward nozzle 30 and detector 34. This embodiment allows for flexibility in placement of sources 12, 14. Detector 24, as shown in FIG. 6, could also incorporate either of the detector layouts shown in FIG. 4 or 5. However, in embodiments using split detector portions, and reflectors, it is contemplated that one source could utilize a reflector while another source could be positioned so that its principal ray is directly incident upon the component, and thus not require a reflector. Further, although FIG. 6 illustrates the use of reflectors between sources 12, 14 and the component, such reflectors could be disposed between the component and detector 34.

FIG. 7 is a diagrammatic view of component measurement and detection system 80 in accordance with an embodiment of the present invention. System 80 is illustrated to show how embodiments of the present invention can be used to detect component offset and rotational orientation for oversized components (e.g. single edge measurements). This discussion is provided to detail computation of rotational ($\alpha$) and positional (x, y) offsets for single edged measurements, and can be extended to double sided measurements. U.S. Pat. No. 5,559,727 to Deley also provides for computation of rotational and positional offsets for double-sided measurements with a different light source/detector arrangement, and is hereby incorporated by reference herein. FIG. 7 shows an example of a single sided measurement with respect to either of sources 12, 14, since only one shadow of an edge falls on each of detectors 24A, 24B. Such components are generally too large to fit shadows of opposite sides simultaneously upon any single detector portion.

FIG. 7 illustrates component 100 casting shadows upon detector portions 24A and 24B. However, each detector portion only captures a single shadow, because component 100 is so large that the shadows of its opposite sides do not fall upon detector portions 24A and 24B. In this embodiment, detector outputs 28A and 28B are monitored while component 100 is rotated in order to detect shadow minimums indicating when respective sides of component 100 are aligned with the a given ray emanating from either of sources 12, 14. For example, in the example shown in FIG. 7, slight counter-clockwise rotation will bring edge 102 of component 100 into alignment with a ray emanating from source 14. Such alignment will generate a local minimum upon detector portion 24A. Although in FIG. 7 it appears that the detectors are positioned at right angles to the sources, it will be understood that non-orthogonal positioning may also be employed.

To determine the x-axis and y-axis offset, the width of the component, the length of all of the sides of the component, and the rotational($\theta$) offset of component 100 in FIG. 7, consider the analogous example of one source-detector pair of FIG. 7 shown in FIG. 8. The length of the minimum shadow width is measured by finding the distance, $D_f$, between shadow edge and detector point $O_f$. The distance $D_f$ is related to component dimension $L_a$ in the following manner. When the distance $D_f$ is at a minimum:

$$\tan(\alpha_1\_\text{side}\_a) = \frac{L_a}{B_1} = \frac{D_1 \cdot \cos(\phi_1 - 90°)}{A_1} \text{ so} \quad \text{Equation 1}$$

$$L_a = \frac{B_1}{A_1} \cdot (D_1 \cdot \cos(\phi_1 - 90°)) \text{ and} \quad \text{Equation 2}$$

$$\alpha_1\_\text{side}\_a = \arctan\left(\frac{D_1 \cdot \cos(\phi_1 - 90°)}{A_1}\right) \quad \text{Equation 3}$$

Equations for $L_c$ and $\alpha_1\_\text{side}\_c$ can be derived similarly when side_c is rotated to a similar position as side_a in FIG. 8. The encoder and encoder electronics 42 captures the encoder rotation, $E_1$, when $D_1$ is at its minimum. If the step size between successive encoder rotations is T, then the part rotation encoder value when side_a is aligned to a reference axis of the pick and place machine is perpendicular to a major axis of detector 24b, is:

$$E_{aligned\_side\_a} = E_1 + \frac{\phi_1 - \alpha_1\_side\_a}{T} \quad \text{Equation 4}$$

Where $\alpha_1\_side\_a$ is the angle formed at point source 12 between the line to $O_1$ on detector 24b and the line to $S_{12}$, and $\theta_1$ is the angle formed at source 12 between the line to $O_1$ on detector 24b and a reference axis in the pick and place machine. The width of the component, $W_{ac}$, can be calculated as:

$$W_{ac} = L_a + L_c \quad \text{Equation 5}$$

And the offset of the nozzle axis 30 (the axis of rotation) from the center of the part along the line W is given by:

$$F_{ac} = \frac{L_c - L_a}{2} \quad \text{Equation 6}$$

The computation process described mathematically by Equations 1–6 can be optionally repeated for the remaining two opposing sides of component 100, from which the orthogonal width and offset can be computed. This process can be iteratively applied to the component 100, where the values $L_a, L_b, L_c, L_d$, (length of sides of component 100) can be derived from any sequence of available minimums cast by sources 12, 14 upon detectors 24b, 24a as determined by the sequencing of energizing of sources 12, 14 and the rotation of the component 100 with respect to these sources.

Those skilled in the art will recognize that for a four-sided component, complete component measurement can be effected in about 225 degrees of rotation (180 degrees to image both edges+45 degrees maximum to image the first edge). This improved process takes significantly less time than one which requires a complete (360) component rotation.

In some cases, the pick-and-place machine may not have a priori knowledge of expected component size. In such cases, the machine can perform a "source scan" where a plurality of sources are sequentially energized to determine if any of the sources are disposed relative to the component to cast at least one shadow portion on at least one detector. If such combination is found, component measurement and alignment can be performed with the useful detector/source combination(s).

Operation of embodiments of the present invention generally involve the following steps. The first step is calibrating the source, nozzle and detector positions with respect to each other. There are a number of techniques that can be employed for this operation. For example, calculation of the positions of the various sensor components can be performed by placing the sensor with test components fixed in position in a coordinate measuring machine and then using the coordinate measuring machine to identify the relative position of all of the test components such that the position of the ray that is incident from the light source or sources onto the detector is known with respect to the nozzle position and detector position.

As a second step, the shadow or shadows from each component cast upon the detector by light incident from the source or sources has a characteristic intensity profile that is processed to extract an edge. The edge position can be interpolated to subpixel position. Such interpolation can be effected using any number of techniques including centroid calculation or curve fitting. This, then, relates a particular edge position to an encoder position and a known source ray position. Then, the defined edge of the shadow provides an $(r, \theta)$ pair where $\theta$ is the position of the encoder that is on the nozzle shaft or attached to the nozzle shaft indicating its relative angular position, and $(r, \theta)$ is the distance from the source to the edge position on the detector that defines the position of the component at that specific point in angular space and time. The $(r, \theta)$ pairs are collected during the rotation of the component on the nozzle. These $(r, \theta)$ pairs are used to derive, using known geometric techniques as per FIG. 7 $(r, \theta, B_i)$ where $\theta$ is used with a to calculate angular part orientation, component information including: component width, component length, nozzle off-set of rotation center x, nozzle off-set of rotation center y, and the angular position of a defined frame of reference of the component with respect to the nozzle angular position. With this information, the component location can be translated into the specific pick and place machine's frame of mechanical reference via software and the component can be properly positioned to be placed upon its target location on the printed circuit board.

Although the present invention has been described with reference to preferred embodiments, workers skilled in the art will recognize that changes may be made in form and detail without departing from the spirit and scope of the invention. For example, multiple portions of detector 24 could be placed within the same plane or without the same plane. Further, such detector portions need not be physically adjacent but may be segments of detectors such that the multiple nozzles' position with respect to the light sources and detectors allow components to be imaged on such detector portions based upon selection of sources that are turned on with respect to components and detector portions.

What is claimed is:

1. A sensor system for computing placement information about a component in an electronic component handling machine, the machine releasably holding the component and adapted to rotate the component, the sensor system comprising:
   a sensor;
   a plurality of light sources in the sensor disposed to illuminate a sensing field in the sensor;
   a detector positioned relative to the light sources so that when the component is at least partially disposed in the sensing field, the component blocks illumination from at least one of the plurality of light sources to form a shadow of at least a portion of the component on the detector, the detector adapted to provide a plurality of detector outputs while the component rotates; and
   computing electronics receiving the detector outputs to compute the placement information.

2. The sensor system of claim 1 further comprising energization electronics coupled to the plurality of light sources for energizing a one of the plurality of light sources substantially at a time.

3. The sensor system of claim 2 where the energization electronics energize the plurality of sources in a first pattern when the component has a first size and in a second pattern when the component has a second size.

4. The sensor system of claim 2 where the energization electronics energize the plurality of sources in a pattern which is independent of a size of the component.

5. The sensor system of claim 1 where the plurality of light sources are laser diodes.

6. The sensor system of claim 1 where the plurality of light sources are LEDs.

7. The sensor system of claim 1 where the plurality of light sources provide substantially incoherent light.

8. The sensor system of claim 1 where the plurality of light sources provide substantially coherent light.

9. The sensor system of claim 1 where the sensor is fixedly mounted on a head of the machine.

10. The sensor system of claim 1 where the sensor is not fixedly mounted on a head of the machine.

11. The sensor system of claim 1 where the energization electronics are in the sensor.

12. The sensor system of claim 1 where the energization electronics are disposed outside the sensor and within the machine.

13. The sensor system of claim 1 where the plurality of light sources are disposed to provide illumination in substantially the same plane.

14. The sensor system of claim 13 where the detector is disposed in the same plane as the plurality of light sources.

15. The sensor system of claim 1 where the machine rotates the component about a nozzle, the sensor system further comprising an encoder operably coupled to the nozzle to provide an encoder signal representative of angular orientation of the nozzle.

16. The sensor system of claim 1 where the detector comprises a plurality of detector portions.

17. The sensor system of claim 16 where the plurality of detector portions are each adjacent to the other portion.

18. The sensor system of claim 16 where the detector portions are coplanar with one another.

19. The sensor system of claim 16 where the detector portions are not coplanar with respect to one another.

20. The sensor system of claim 16 where each detector portion is disposed to image a different part of the component at a specific rotation, and each detector portion provides a data group based on the partial shadow, where the data groups when assembled by the computing electronics include a characteristic cusp, the characteristic cusp from a first data group occurring at a different orientation of the component than a characteristic cusp from a second data group.

21. The sensor system of claim 16 where each of the detector portions is disposed to have a principal axis oriented at an angle relative to another detector portion.

22. The sensor system of claim 21 where the angle is about ninety degrees.

23. The sensor system of claim 1 where the plurality of light sources comprises three light sources.

24. The sensor system of claim 1 further comprising a reflector disposed between at least one of the plurality of light sources and the detector.

25. The sensor of claim 1 further comprising a reflector disposed between the component and the detector.

26. A sensor system for computing placement information about a component in an electronics component handling machine, the machine releasably holding the component and adapted to rotate the component, the sensor system comprising:
  a sensor;
  a plurality of light sources coupled to an energization bus for energizing the light sources;
  a detector positioned relative to the light sources so that when the component blocks the illumination the detector provides an output representative of a shadow of the component thereon, the detector providing a plurality of outputs as the component rotates;
  energization electronics for providing the energization bus;
  computing electronics coupled to the output of the detector for assembling the plurality of outputs to compute the placement information, where the energization bus energizes a one of the plurality of light sources substantially at a time.

27. The sensor system of claim 26 further comprising a sensing field in the sensor illuminated by the plurality of light sources, the sensor operable when the component is partially disposed in the sensing field.

28. The sensor system of claim 26 where the energization electronics energize the plurality of sources in a first pattern when the component has a first size and in a second pattern when the component has a second size.

29. The sensor system of claim 26 where the energization electronics energize the plurality of sources in a pattern independent of a size of the component.

30. The sensor system of claim 26 where the plurality of light sources are laser diodes.

31. The sensor system of claim 26 where the plurality of light sources are LEDs.

32. The sensor system of claim 26 where the plurality of light sources provide substantially incoherent light.

33. The sensor system of claim 26 where the plurality of light sources provide substantially coherent light.

34. The sensor system of claim 26 where the sensor is fixedly mounted to move with the head of the machine.

35. The sensor system of claim 26 where the sensor is not fixedly mounted to move with the head of the machine.

36. The sensor system of claim 26 where the energization electronics are in the sensor.

37. The sensor system of claim 26 where the energization electronics are disposed outside the sensor and within the machine.

38. The sensor system of claim 26 where the machine rotates the component about a nozzle, the sensor system further comprising an encoder operably coupled to the nozzle to provide an encoder signal representative of angular orientation of the nozzle.

39. The sensor system of claim 26 where the detector comprises a plurality of detector portions.

40. The sensor system of claim 39 where the plurality of detector portions are each adjacent to the other portion.

41. The sensor system of claim 39 where the detector portions are coplanar with one another.

42. The sensor system of claim 39 where the detector portions are not coplanar with respect to one another.

43. The sensor system of claim 39 where each detector portion is disposed to image a different part of the component at a specific rotation, and each detector portion provides a data group based on the partial shadow, where the data groups when assembled by the computing electronics include a characteristic cusp, the characteristic cusp from a first data group occurring at a different orientation of the component than a characteristic cusp from a second data group.

44. The sensor system of claim 39 where each of the detector portions is disposed to have a principal axis oriented at an angle relative to another detector portion.

45. The sensor system of claim 44 where the angle is about ninety degrees.

46. The sensor system of claim 26 where the plurality of light sources comprises three light sources.

47. The sensor, system of claim 26 further comprising a reflector disposed between at least one of the plurality of light sources and the detector.

48. The sensor system of claim 26 further comprising a reflector disposed between the component and the detector.

49. The sensor system of claim 26 where the machine is a pick and place machine.

50. The sensor system of claim 26 where the placement information includes an x,y and angular orientation of the component.

51. A sensor system for computing placement information about a component in an electronic component handling machine, the sensor system comprising:

a sensor releasably held by the machine, the machine adapted to rotate the sensor around the component;

a plurality of light sources in the sensor disposed to illuminate a sensing field in the sensor;

a detector positioned relative to the light sources so that when the component is at least partially disposed in the sensing field, the component blocks illumination from at least one of the plurality of light sources to form a shadow of at least a portion of the component on the detector, the detector adapted to provide a plurality of detector outputs while the component rotates; and computing electronics receiving the detector outputs to compute the placement information.

52. A method for computing placement information about a component, method comprising:

1) picking up the component;
2) transporting the component to a sensing field within a sensor, the component partially within the sensing field;
3) energizing a first light source within the sensor, the first light source illuminating a portion of the component from a first angle so as to form a shadow on a detector;
4) capturing the shadow and providing a detector output at a first angular orientation of the component;
5) energizing a second light source within the sensor, the second light source illuminating a portion of the component from a second angle so as to form a shadow on the detector;
6) capturing the shadow and providing a detector output at a second angular orientation of the component;
7) repeating the steps 3) through 6) for a plurality of angular orientations of the component; and
8) processing the detector outputs and the angular orientations associated therewith to compute an orientation of the component.

53. The method of claim 52 where the orientation includes an x, y and angular position of the component relative to a machine coordinate system.

* * * * *